(12) United States Patent
Otremba et al.

(10) Patent No.: US 9,082,759 B2
(45) Date of Patent: Jul. 14, 2015

(54) SEMICONDUCTOR PACKAGES AND METHODS OF FORMATION THEREOF

(71) Applicant: Infineon Technologies AG, Neubiberg (DE)

(72) Inventors: Ralf Otremba, Kaufbeuren (DE); Klaus Schiess, Allensbach (DE); Fabio Brucchi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 13/686,767

(22) Filed: Nov. 27, 2012

(65) Prior Publication Data

US 2014/0145318 A1    May 29, 2014

(51) Int. Cl.
*H01L 23/495* (2006.01)
*H01L 21/56* (2006.01)
*H01L 23/31* (2006.01)

(52) U.S. Cl.
CPC .... *H01L 23/49503* (2013.01); *H01L 23/49562* (2013.01); *H01L 23/49575* (2013.01); *H01L 21/568* (2013.01); *H01L 23/3107* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2924/12032* (2013.01); *H01L 2924/1301* (2013.01); *H01L 2924/1305* (2013.01); *H01L 2924/13055* (2013.01); *H01L 2924/13062* (2013.01); *H01L 2924/19107* (2013.01)

(58) Field of Classification Search
USPC .............. 257/666, 676, 670, 669, E23.031
See application file for complete search history.

(56) References Cited

U.S. PATENT DOCUMENTS 6,348,726 B1 *  2/2002  Bayan et al. ................. 257/666
6,400,004 B1 *  6/2002  Fan et al. ..................... 257/666
(Continued)

OTHER PUBLICATIONS

Serenson, James A. Jr., "The Effect of Solder Mask and Surface Mount Adhesive Types on a PCB Manufacturing Process", 13 pages.
(Continued)

*Primary Examiner* — Nitin Parekh
(74) *Attorney, Agent, or Firm* — Slater & Matsil, L.L.P.

(57) ABSTRACT

In accordance with an embodiment of the present invention, a semiconductor package includes a die paddle, and an encapsulant disposed around the die paddle. The semiconductor package has a first sidewall and a second sidewall. The second sidewall is perpendicular to the first sidewall. The first sidewall and the second sidewall define a corner region. A tie bar is disposed within the encapsulant. The tie bar couples the die paddle and extends away from the die paddle. A dummy lead is disposed in the corner region. The dummy lead is not electrically coupled to another electrically conductive component within the semiconductor package. The distance between the dummy lead and the tie bar is less than a shortest distance between the tie bar and other leads or other tie bars in the semiconductor package.

34 Claims, 14 Drawing Sheets

(56) References Cited

U.S. PATENT DOCUMENTS

| | | | |
|---|---|---|---|
| 6,617,197 B1 * | 9/2003 | Bayan et al. | 438/112 |
| 6,639,305 B2 | 10/2003 | Carter et al. | |
| 7,282,786 B2 * | 10/2007 | Jung et al. | 257/666 |
| 7,291,869 B2 | 11/2007 | Otremba | |
| 7,872,350 B2 | 1/2011 | Otremba et al. | |
| 7,875,963 B1 * | 1/2011 | Kim et al. | 257/670 |
| 7,936,053 B2 * | 5/2011 | Punzalan et al. | 257/670 |
| 8,115,294 B2 | 2/2012 | Otremba et al. | |
| 8,120,161 B2 | 2/2012 | Otremba et al. | |
| 2007/0114645 A1 * | 5/2007 | Punzalan et al. | 257/678 |
| 2008/0224323 A1 | 9/2008 | Otremba | |

OTHER PUBLICATIONS

"IGBT Selection Guide", Common IGBT Applications and Topologies, Aug. 2012, 6 pages.

"Intergrated Power Module for Small Appliance Motor Drive Applications", International Rectifier, IRSM 836-045MA, Apr. 30, 2012, 19 pages.

Serenson, J. A. Jr., "The Effect of Solder Mask and Surface Mount Adhesive Types on a PCB Manufacturing Process," Universal Instruments, Jul. 20, 2004, 13 pages.

* cited by examiner

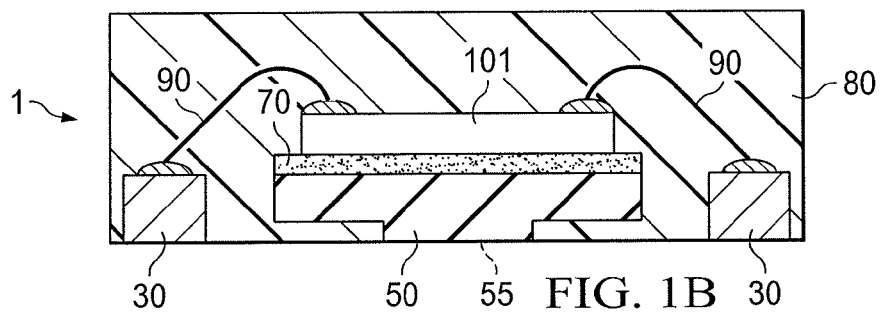
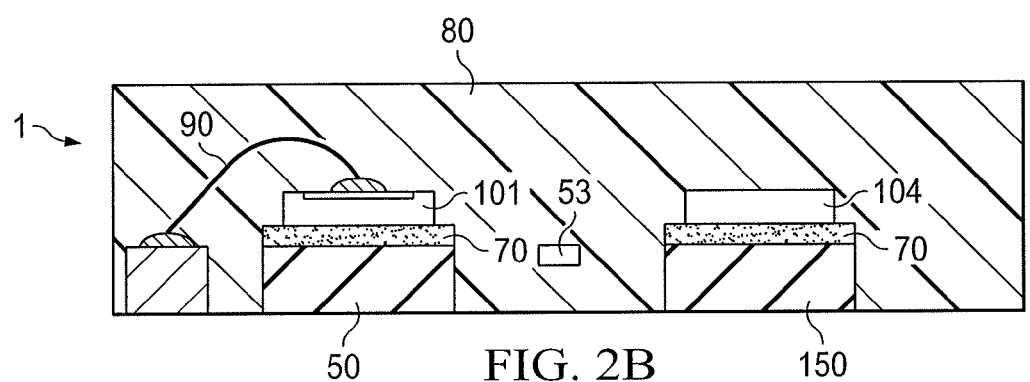
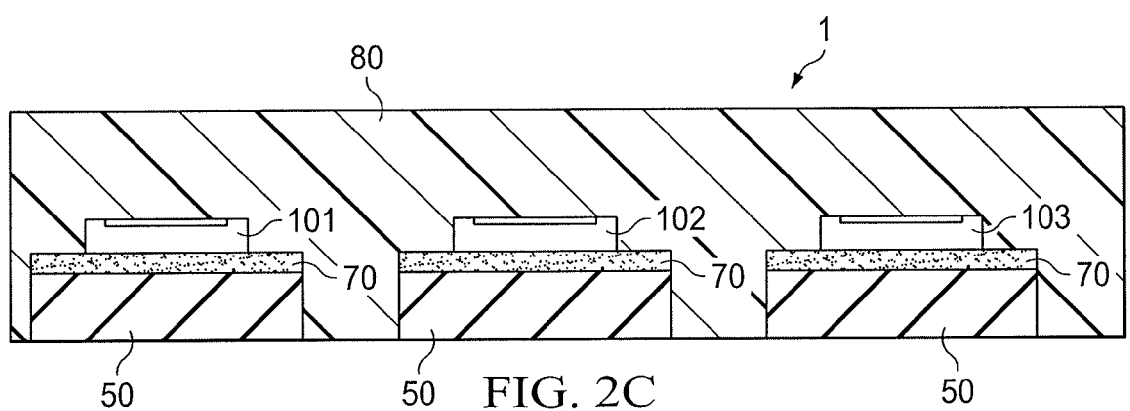

SEMICONDUCTOR PACKAGES AND METHODS OF FORMATION THEREOF

TECHNICAL FIELD

The present invention relates generally to semiconductor devices, and more particularly to semiconductor packages and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

Packaging may be a cost intensive process because of the complexity of connecting multiple electrical connections to external pads while protecting these electrical connections and the underlying chips.

SUMMARY OF THE INVENTION

In accordance with an embodiment of the present invention, a semiconductor package comprises a die paddle, and an encapsulant disposed around the die paddle. The semiconductor package has a first sidewall and a second sidewall. The second sidewall is perpendicular to the first sidewall. The first sidewall and the second sidewall define a corner region. A tie bar is disposed within the encapsulant. The tie bar couples the die paddle and extends away from the die paddle. A dummy lead is disposed in the corner region. The dummy lead is not electrically coupled to another electrically conductive component within the semiconductor package. The distance between the dummy lead and the tie bar is less than a shortest distance between the tie bar and other leads or other tie bars in the semiconductor package.

In accordance with an alternative embodiment of the present invention, a semiconductor package comprises a package body having a first sidewall and a second sidewall. The second sidewall is perpendicular to the first sidewall. The first sidewall and the second sidewall define a edge. A plurality of leads is disposed along the first sidewall. Each lead is electrically coupled to another component within the semiconductor package. A conductor is disposed proximate the edge within the package body, the conductor not being coupled to another electrically conductive component within the semiconductor package. Each lead of the plurality of leads is spaced apart from another lead of the plurality of leads by a minimum creepage distance. The distance between the conductor and a lead of the plurality of leads is less than the creepage distance.

In accordance with an alternative embodiment of the present invention, a leadframe comprises a frame having an opening, and a die paddle disposed within the opening. The die paddle is configured to mount a plurality of dies. A plurality of leads is arranged along a side of the die paddle. The plurality of leads extend away from the die paddle. A tie bar connects the die paddle to the frame. A dummy lead is disposed in a corner region. The minimum creepage distance between each lead and the tie bar is larger than a distance between the dummy lead and the tie bar.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor package in accordance with an embodiment of the invention, wherein FIG. 1A illustrates a plan view, FIG. 1B illustrates a cross-sectional view, and FIG. 1C illustrates a bottom view;

FIG. 2, which includes FIGS. 2A-2E, illustrates a power semiconductor package in accordance with an embodiment of the present invention, wherein FIG. 2A illustrates a plan view, FIGS. 2B and 2C illustrate cross-sectional views, FIG. 2D illustrates a bottom view, and FIG. 2E illustrates a schematic circuit of the power semiconductor package;

FIG. 3, which includes FIGS. 3A-3B, illustrates alternative embodiments of the semiconductor package, wherein FIG. 3A illustrates a different configuration of the multi-chip module showing a plurality of dummy leads having different sizes and shapes, wherein FIG. 3B illustrates an alternative embodiment showing the placement of the dummy leads relative to functional leads;

FIG. 5, which includes FIGS. 5A and 5B, illustrates a semiconductor package during a stage of fabrication, wherein FIG. 5A illustrates a cross-sectional view while FIG. 5B illustrates a top view;

FIG. 6, which includes FIGS. 6A and 6B, illustrates a semiconductor package during a subsequent stage of fabrication after attaching dies to the lead frames, wherein FIG. 6A illustrates a cross-sectional view while FIG. 6B illustrates a top view;

FIG. 7, which includes FIGS. 7A and 7B, illustrates a semiconductor package during a subsequent stage of fabrication after forming interconnects in accordance with embodiments of the invention, wherein FIG. 7A illustrates a cross-sectional view while FIG. 7B illustrates a top view;

FIG. 9, which includes FIGS. 9A-9C, illustrates an alternative embodiment of the semiconductor package using a different dummy lead, wherein FIG. 9A illustrates a cross-sectional view while FIGS. 9B and 9C illustrate alternative top views;

Corresponding numerals and symbols in the different figures generally refer to corresponding parts unless otherwise

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In a semiconductor package, leads provide electrical connection to various dies within the package. The leads also mechanically secure the package over the component to which it is attached (e.g., circuit board). However, the number of electrical leads may be limited especially in case of power semiconductor packages. Further, the electrical leads may have strict design rules. Therefore, in many cases, the various limitations on the size and placement of electrical leads may hinder the formation of a mechanically secure package. For example, in a small sized package such as a 12×12 mm$^2$, additional electrical leads may not be introduced due to the limitations imposed by the creepage and clearance requirements. For example, the creepage distance may be about a few millimeters at high voltages above 100V, e.g., about 2.5 mm at about 400V. As a consequence, the number of functional leads is limited, which may result in improper anchoring of the semiconductor package to a circuit board. Various embodiments of the present invention overcome these and other problems.

A structural embodiment of a semiconductor package will be described using FIG. 1. Further structural embodiments of the semiconductor package will be described using FIGS. 2-4, 9, and 10. FIGS. 5-9 will be used to describe an assembly process to form a semiconductor package in accordance with embodiments of the invention. An embodiment of a lead frame strip will be described using FIGS. 5 and 11.

Figure 1A:
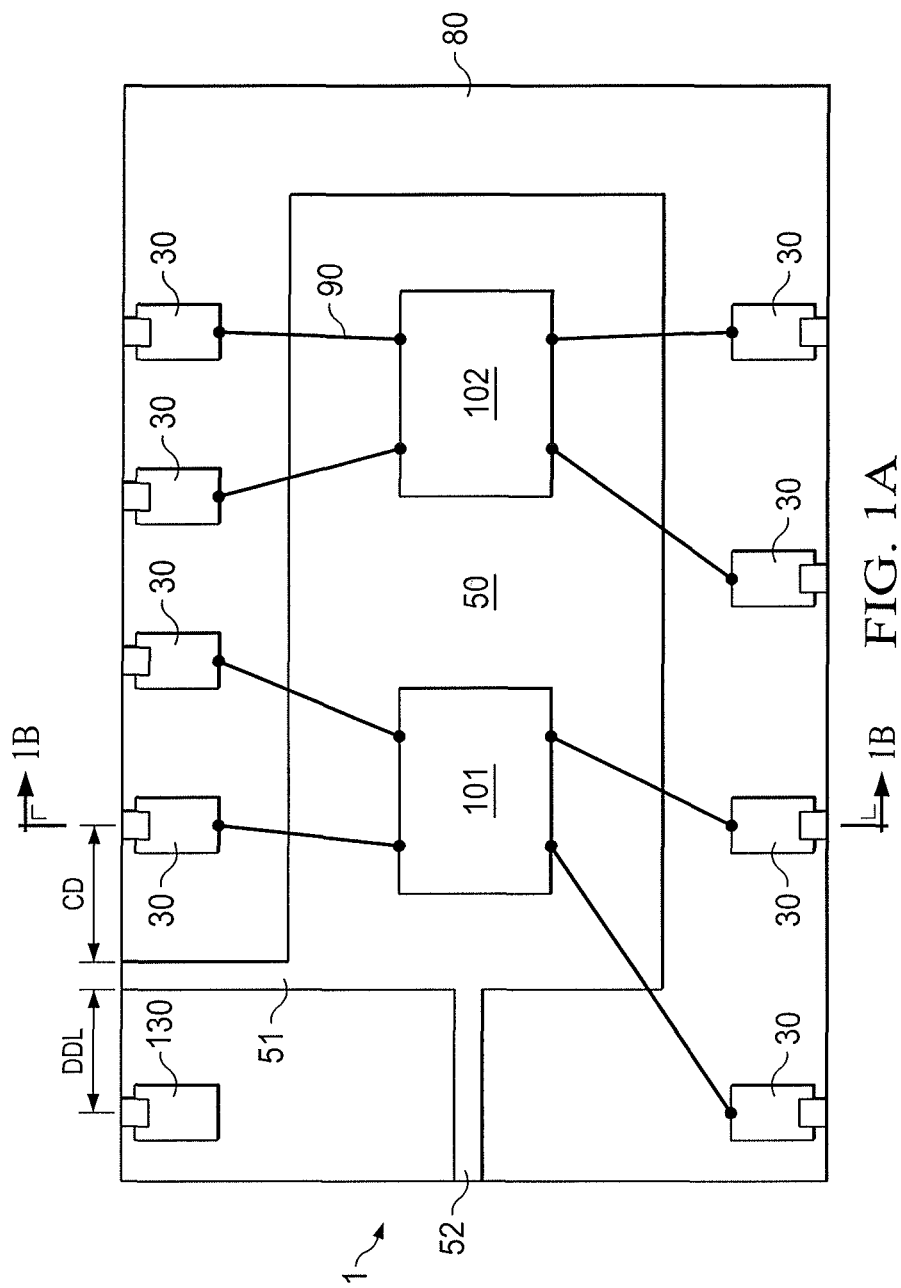
Figure 1C:
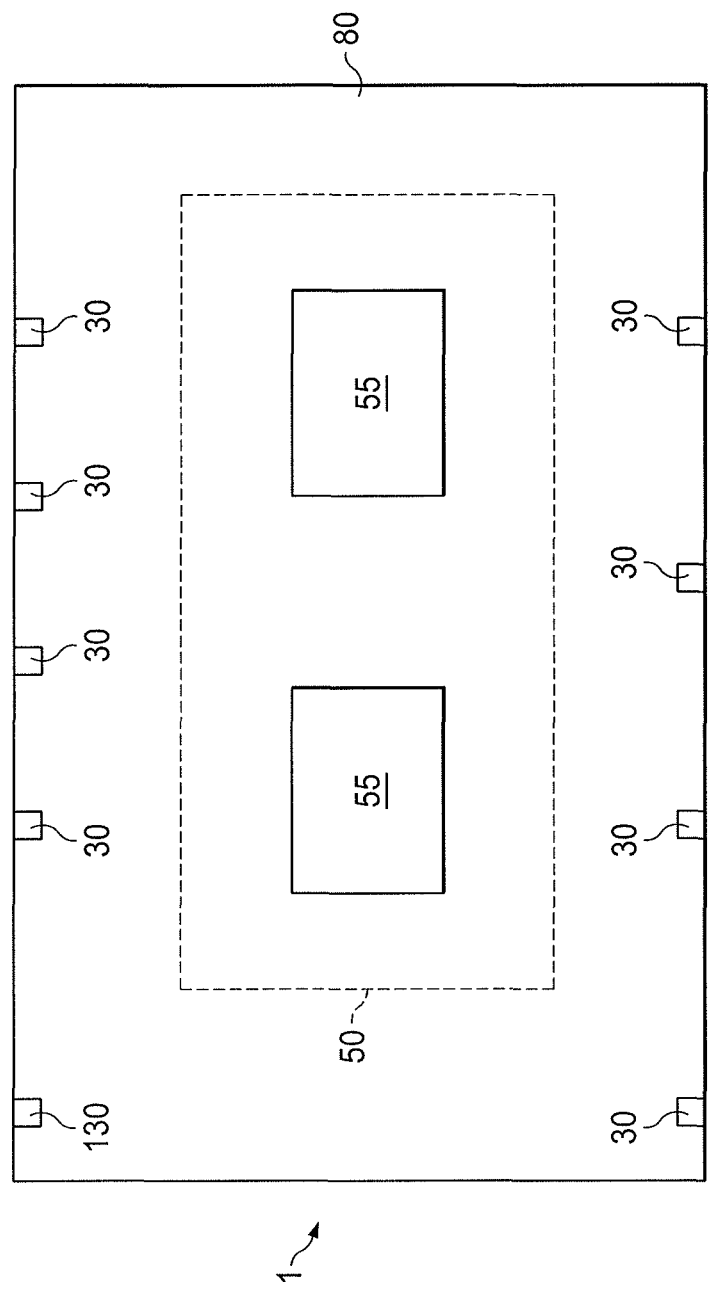

FIG. 1, which includes FIGS. 1A-1C, illustrates a semiconductor package in accordance with an embodiment of the invention. FIG. 1A illustrates a plan view, FIG. 1B illustrates a cross-sectional view, and FIG. 1C illustrates a bottom view.

In various embodiments, the semiconductor package 1 is a multi-chip module comprising a plurality of chips. In various embodiments, the semiconductor package 1 comprises a power module, e.g., supporting power dies operating at high voltages (e.g., greater than 100 V).

Referring to FIG. 1A, the semiconductor package 1 includes a die paddle 50 embedded within an encapsulating material 80. A first die 101 and a second die 102 are disposed over the die paddle 50. In one or more embodiments, the first die 101 and the second die 102 may comprise discrete power dies. Examples of the first die 101 and the second die 102 may include PIN or Schottky diodes, MISFET, JFET, BJT, IGBT, or thyristor.

The die paddle 50 may have been supported by tie bars during the packaging process, and may therefore include portions of the tie bar, which are left after dicing the lead frame strip. For example, the die paddle 50 may be coupled to a portion of a vertical tie bar 51 and another portion of a horizontal tie bar 52.

The vertical tie bar 51 and the horizontal tie bar 52 may be coupled to a first potential node thereby coupling the bottom surfaces of the first die 101 and the second die 102 to the first potential node. In one embodiment, the first potential node may be a high voltage node, e.g., may be higher than about 100V. For example, in one embodiment, the first potential node may be coupled to voltages between 100V to about 500V, and about 400V in one embodiment.

A plurality of leads 30 is disposed along the edges of the encapsulating material 80. The first die 101 and the second die 102 are coupled to the plurality of leads 30 via interconnects 90. The interconnect 90 may comprise wire bonds, clip, and other structures in various embodiments.

Additionally, one or more dummy leads 130 are disposed along the edges of the package in various embodiments. The dummy leads 130 may be positioned in corner regions of the semiconductor package in one or more embodiments. In further embodiments, the dummy leads 130 are not coupled to other components within the semiconductor package 1. For example, the dummy leads 130 are not electrically coupled to the first die 101 or the second die 102 by interconnects 90. Further, the dummy leads 130 are also not coupled thermally to the first die 101 or the second die 102.

Rather, in various embodiments, the dummy leads 130 are provided to improve mechanical stability. In various embodiments, the dummy leads 130 improve the stability of the package body from mechanical stress related failures. For example, the corners of the package may be subject to a stress concentration, which may result in the failure of the package over a life time of the product. As an illustration, the contact pads (solder) at the corner regions may crack or delaminate the encapsulation. Embodiments of the invention improve the reliability of the semiconductor package by improving the susceptibility of the semiconductor package to mechanical stress.

Referring to FIG. 1A, embodiments of the invention introduce dummy leads 130 without degrading the electrical isolation of the semiconductor package. For example, the creepage distance is a minimum distance between electrical components or conductive components within the semiconductor package as measured along the surface of the package body. In various embodiments, the introduction of the dummy leads 130 does not degrade the creepage distance because the dummy leads 130 are not coupled to electrical circuitry.

Similarly, in various embodiments, the dummy leads 130 are introduced without degrading the clearance distance, which is the distance between conductive components as measured along a path outside (air) the package body. Thus, in various embodiments, the addition of the dummy leads 130 does not significantly impact the clearance, which is needed to prevent dielectric breakdown associated to ionization of air.

In various embodiments, dummy leads 130 are provided to securely anchor the semiconductor package to a board. In various embodiments, additional leads, lead like structures, or other conductive structures are introduce to generate a uniform stress concentration along the semiconductor package. However, the additional leads are not electrically or thermally connected to other components. Therefore, these dummy leads 130 do not follow the more stringent spacing requirements for the plurality of leads 30.

FIG. 1B illustrates a cross-sectional view and illustrates that the die paddle 50 is coupled to the first die 101 through an adhesive layer 70. In various embodiments, the adhesive layer 70 may be a thermal and/or electrical conductive layer. Thus, the first die 101 is coupled to the die paddle 50. FIG. 1C illustrates a bottom view of the semiconductor package 1 showing the exposed plurality of leads 30, the dummy leads 130. In some embodiments, the dummy leads 130 may be fully covered from the back surface. Therefore, in the bottom view, the dummy leads 130 may not be visible. The die paddle 50 may be coupled through bottom contact pads 55 to a circuit board or a substrate.

Figure 2A:
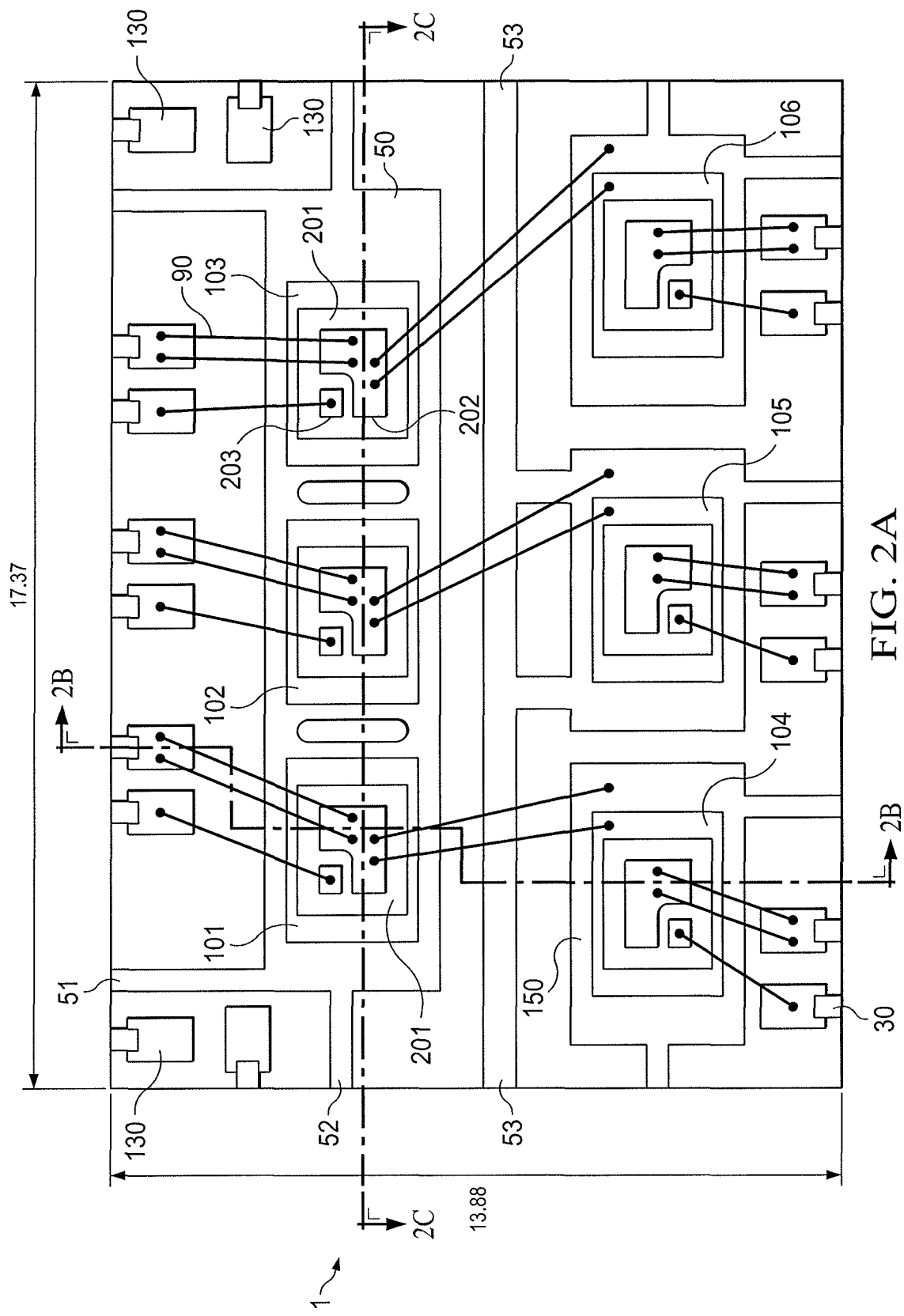
Figure 2D:
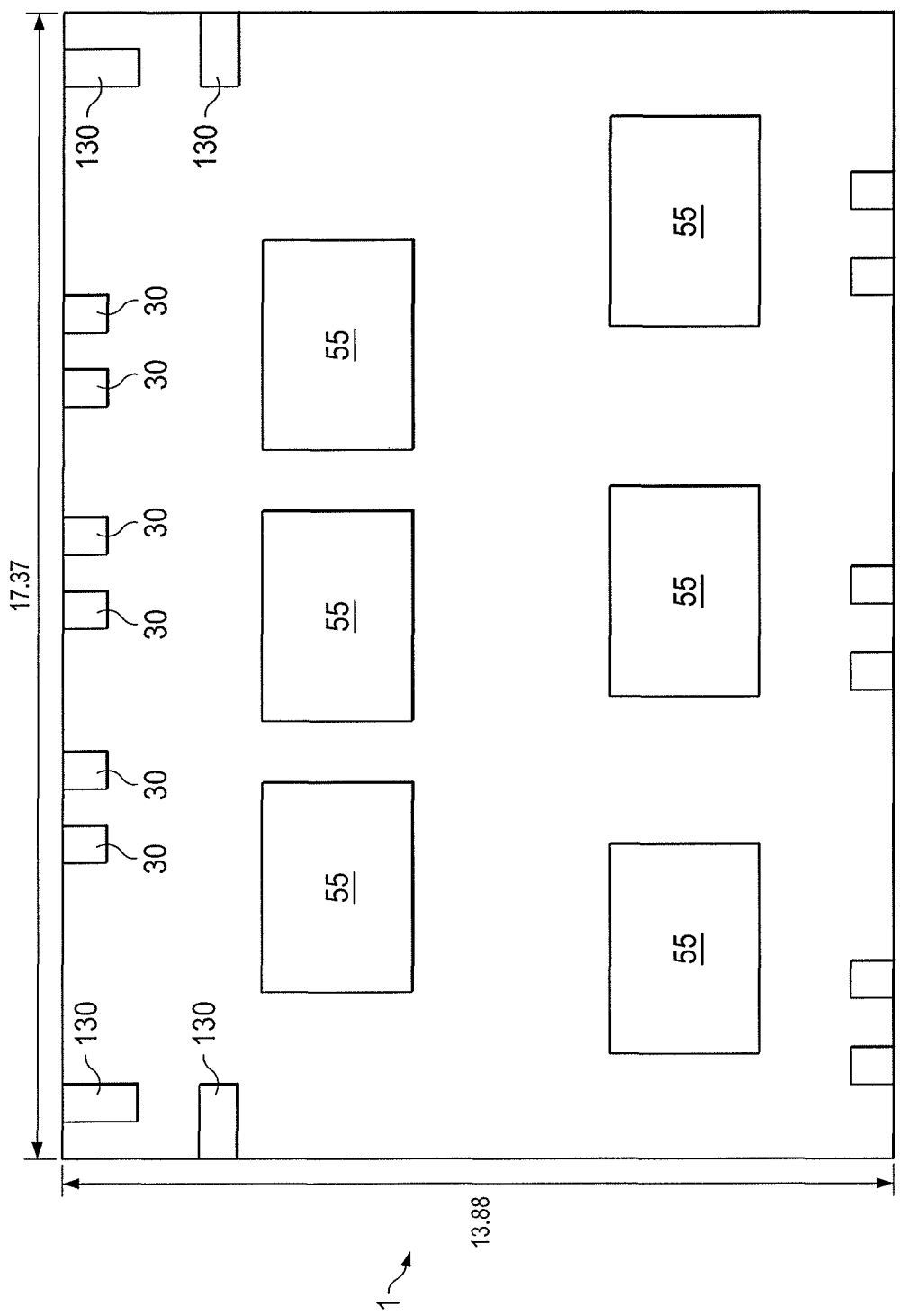
Figure 2E:
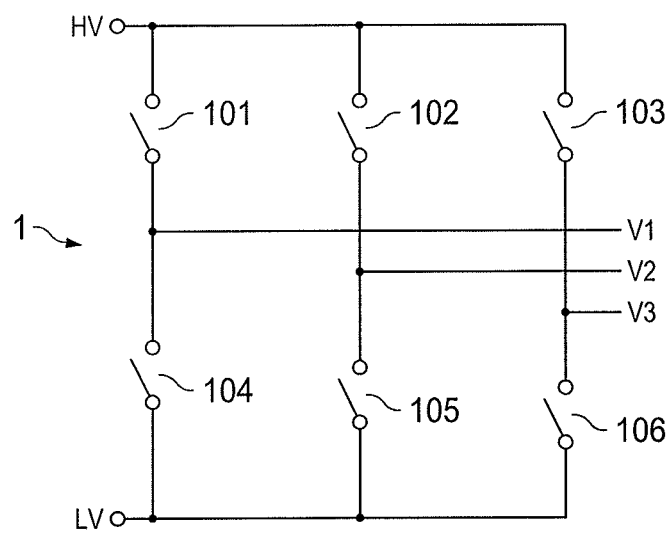

FIG. 2, which includes FIGS. 2A-2E, illustrates a power semiconductor package in accordance with an embodiment of the present invention. FIG. 2A illustrates a plan view, FIGS. 2B and 2C illustrate cross-sectional views, FIG. 2D illustrates a bottom view, and FIG. 2E illustrates a schematic circuit of the power semiconductor package.

Referring to FIG. 2A, the semiconductor package 1 comprises a first die paddle 50 and a plurality of second die paddles 150 disposed proximate the first die paddle 50. The first die paddle 50 and the plurality of second die paddles 150 are supported by vertical tie bars 51 and horizontal tie bars 52 along with one or more central tie bars 53.

A first die 101, a second die 102, and a third die 103 are disposed over the first die paddle 50. Similarly, a fourth die 104 is disposed over a die pad of the plurality of second die paddles 150, a fifth die 105 is disposed over a die pad of the plurality of second die paddles 150, and a sixth die 106 is disposed over a die pad of the plurality of second die paddles 150. Unlike the first die paddle 50, each of the plurality of second die paddle 150 support only a single die in the illustrated embodiment. However, in various embodiments, the multichip module may have different configurations with regard to the number and size of die paddles and the number of dies.

In various embodiments, each die includes contact openings, which would expose a plurality of contact pads. As illustrated in FIG. 2A, each die such as the first die 101 includes a contact opening 201. The first die 101 may include a plurality of contact pads such as a primary contact pad 202 and an auxiliary contact pad 203. The primary contact pad 202 may be coupled to a source/drain region of a discrete transistor die in one or more embodiments. Alternatively, the primary contact pad 202 may be coupled to an emitter/collector region of the discrete transistor die. The auxiliary contact pad 203 may be coupled to a gate region or alternatively to a base region of a transistor.

As illustrated in FIG. 2A, the primary contact pad 202 and the auxiliary contact pad 203 are coupled to the plurality of leads 30 through interconnects 90. Further, the interconnects 90 may also interconnect the dies internally. For example, the primary contact pad 202 of the first die 101 is coupled to the second die paddle 150 supporting the fourth die 104. Similarly, the primary contact pad 202 of the second die 102 is coupled to the second die paddle 150 supporting the fifth die 105.

Referring to cross-sectional views of FIGS. 2B and 2C, each die is supported to the corresponding die paddle by an adhesive layer 70, which may be an electrically conductive layer in some embodiments.

FIG. 2D illustrates a bottom view of the semiconductor package 1 in one or more embodiments. The die paddles may be contacted using bottom contact pads 55. As illustrated in FIG. 2D, in one or more embodiments, the dummy leads 130 are exposed along with the plurality of leads 30.

FIG. 2E illustrates a schematic diagram of the multi-chip module in accordance with an embodiment of the invention.

In the illustration, a three-phase motor control circuit is illustrated as an example. However, in other embodiments, the multichip module may be any power module and may include converters, full bridge circuits and half bridge circuits, e.g., used in inverters and universal power supply, and others.

Referring to FIG. 2E, the module comprises the first die 101, the second die 102, and the third die 103 coupled to a high voltage node (HV). The module further comprises the fourth die 104, the fifth die 105, and the sixth die 106 coupled to a low voltage node (LV). The first die 101, the second die 102, and the third die 103 form the high-side switches of the three-phase motor control circuit while the fourth die 104, the fifth die 105, and the sixth die 106 forms the low side switches. The three phase output supply is outputted through the first, the second, and the third voltage nodes V1, V2, and V3.

Figure 3A:
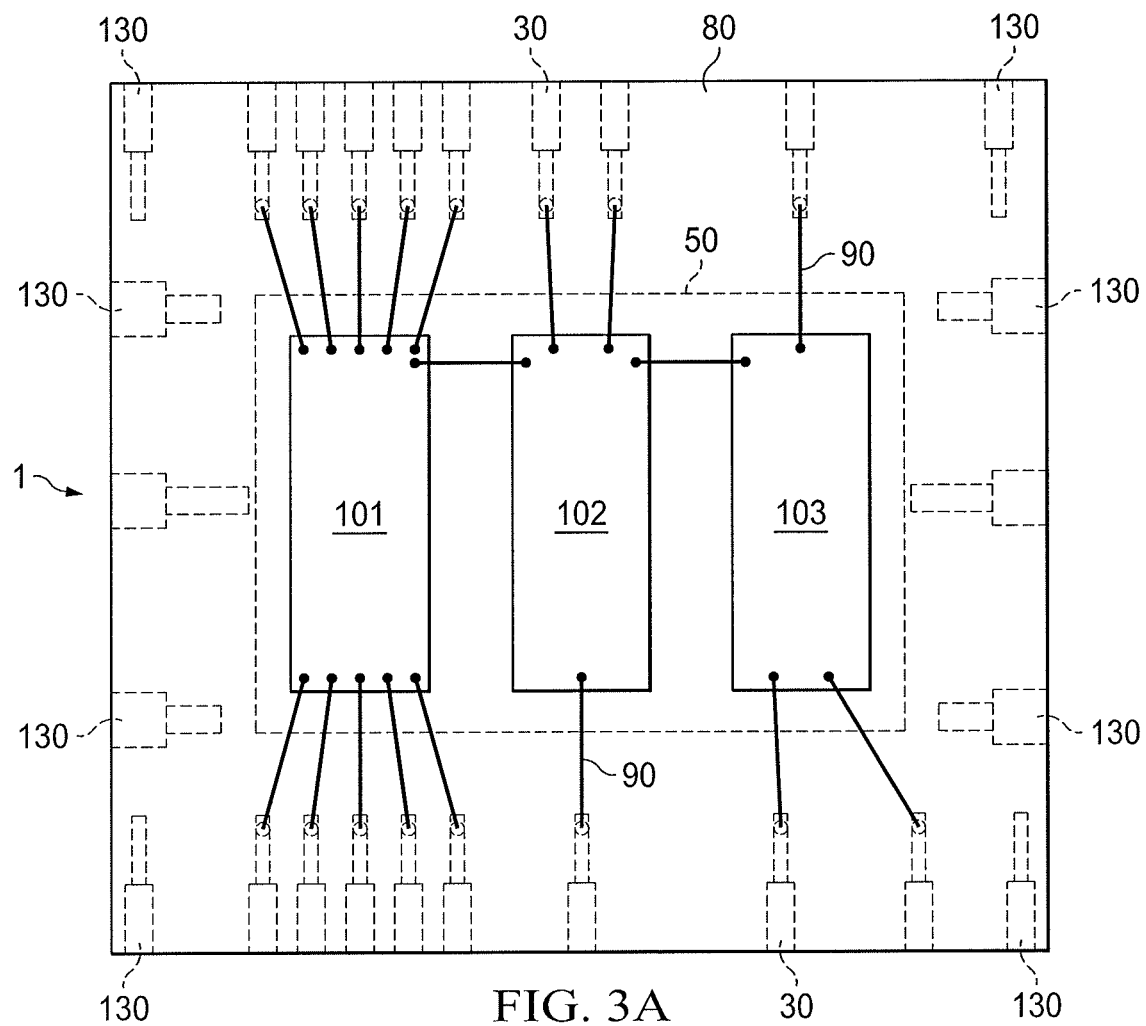
Figure 3B:
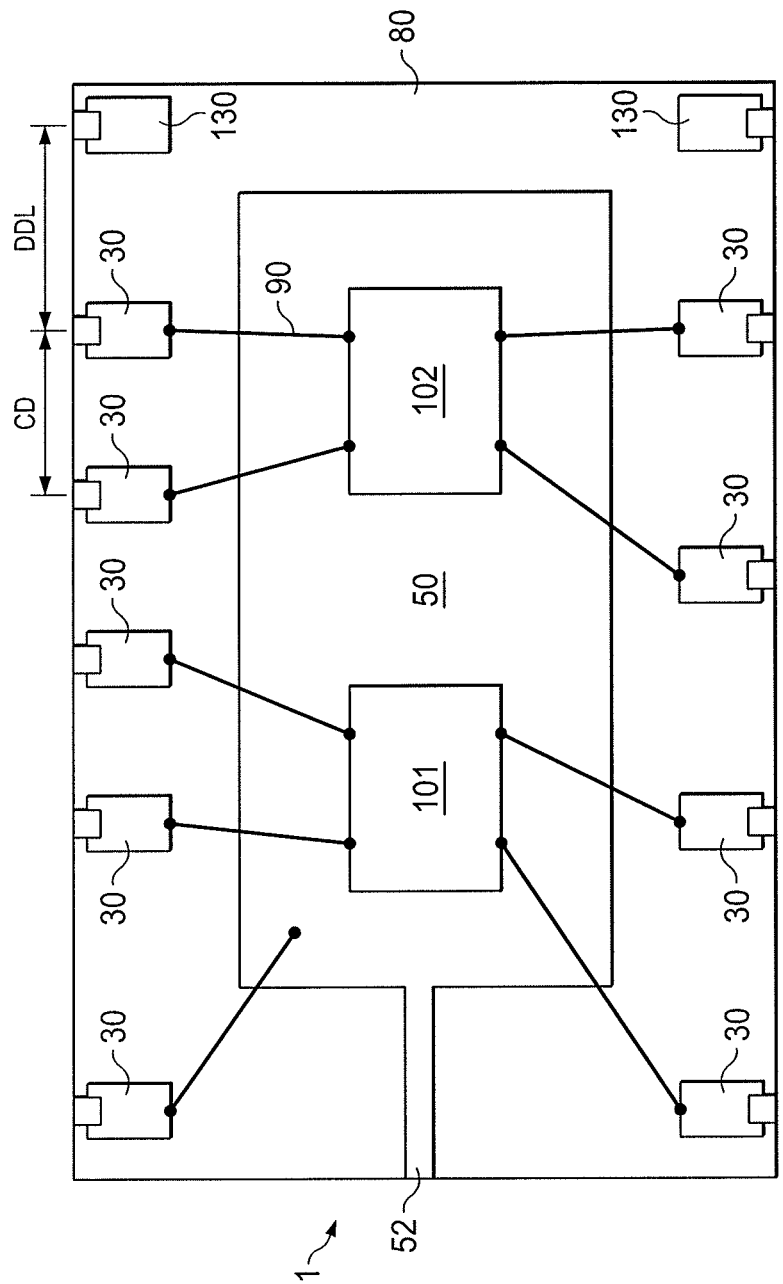

FIG. 3, which includes FIGS. 3A-3B, illustrates alternative embodiments of the semiconductor package. FIG. 3A illustrates a different configuration of the multi-chip module showing a plurality of dummy leads having different sizes and shapes. FIG. 3B illustrates an alternative embodiment showing the placement of the dummy leads relative to functional leads.

Referring to FIG. 3A, the dummy leads 130 may have different sizes depending on the location with respect to other leads as well as the structure of the semiconductor package. In various embodiments, the dummy leads 130 may be used for anchoring the semiconductor package 1 to a circuit board. The dummy leads 130 are not coupled to any components within the semiconductor package 1 and therefore provide flexibility in their placement. Unlike the plurality of leads 30, which are spaced apart by the creepage distance, the dummy leads 130 may not have such limitations.

As an illustration, the first die 101 may comprise an integrated chip with a plurality of leads that may be closely spaced due to the lower voltages. However, the second die 102 and the third die 103 may comprise power chips operating at higher voltages. Therefore, the corner regions around the third die 103 (right top and bottom sides of the page) do not have sufficient room for placing additional functional leads. In contrast, in various embodiments, a plurality of dummy leads 130 may be placed to improve the mechanical stability of the semiconductor package 1. Similarly, the larger dummy leads 130 may be placed on the sides of the semiconductor package 1.

FIG. 3B illustrates an alternative embodiment showing the placement of the dummy leads relative to functional leads. As illustrated in FIG. 3B, the dummy lead 130 may be spaced apart from one of the plurality of leads 30 by a dummy lead distance (DDL), which may be smaller than the minimum distance of adjacent leads of the plurality of leads 30, which is the creepage distance (CD). In the illustrated design, a electrical lead of the plurality of leads 30 may not be placed in the corner region of the semiconductor package 1 because that would violate the creepage requirements. In contrast, the dummy leads may be placed without compromising creepage while providing mechanical stability to the semiconductor package 1.

Figure 4:
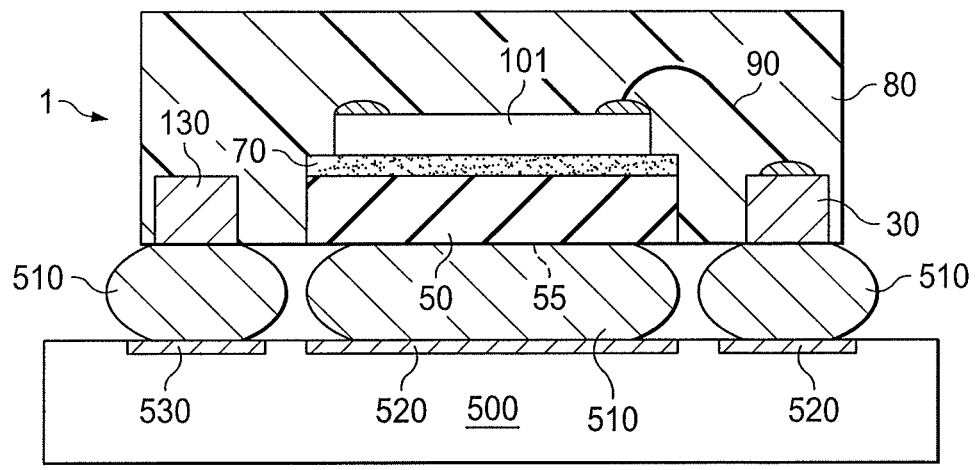
FIG. 4 illustrates a semiconductor package mounted on a circuit board in accordance with an embodiment of the invention.

FIG. 4 illustrates a semiconductor package mounted on a circuit board in accordance with an embodiment of the invention.

The semiconductor package 1 comprises a plurality of contact pads 55 and a plurality of leads 30 for connecting the semiconductor dies within the semiconductor package 1 to various external components. The semiconductor package may be mounted over a circuit board 500 using a plurality of board contacts 510. For example, the plurality of contact pads 55 and the plurality of leads 30 are joined to the circuit board 500 at active circuit pads 520. The physical connection also provides electrical connection to the semiconductor package 1.

In various embodiments, the dummy leads 130 are also coupled to the circuit board 500 at anchor circuit pads 530. However, the anchor circuit pads 530 on the circuit board 500 are different from the active circuit pads 520. Unlike the active circuit pads 520, which are coupled to other components on the circuit board, the anchor circuit pads 530 have no further connection or metal traces emanating from them. The anchor circuit pads 530 help to anchor the semiconductor package 1 and provide no electrical or thermal connection.

FIGS. 5-9 will be used to describe an assembly process to form a semiconductor package in accordance with embodiments of the invention.

Figure 5A:
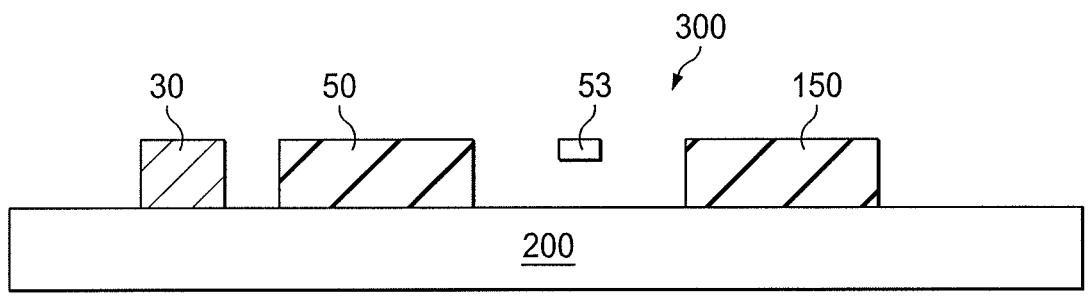
Figure 5B:
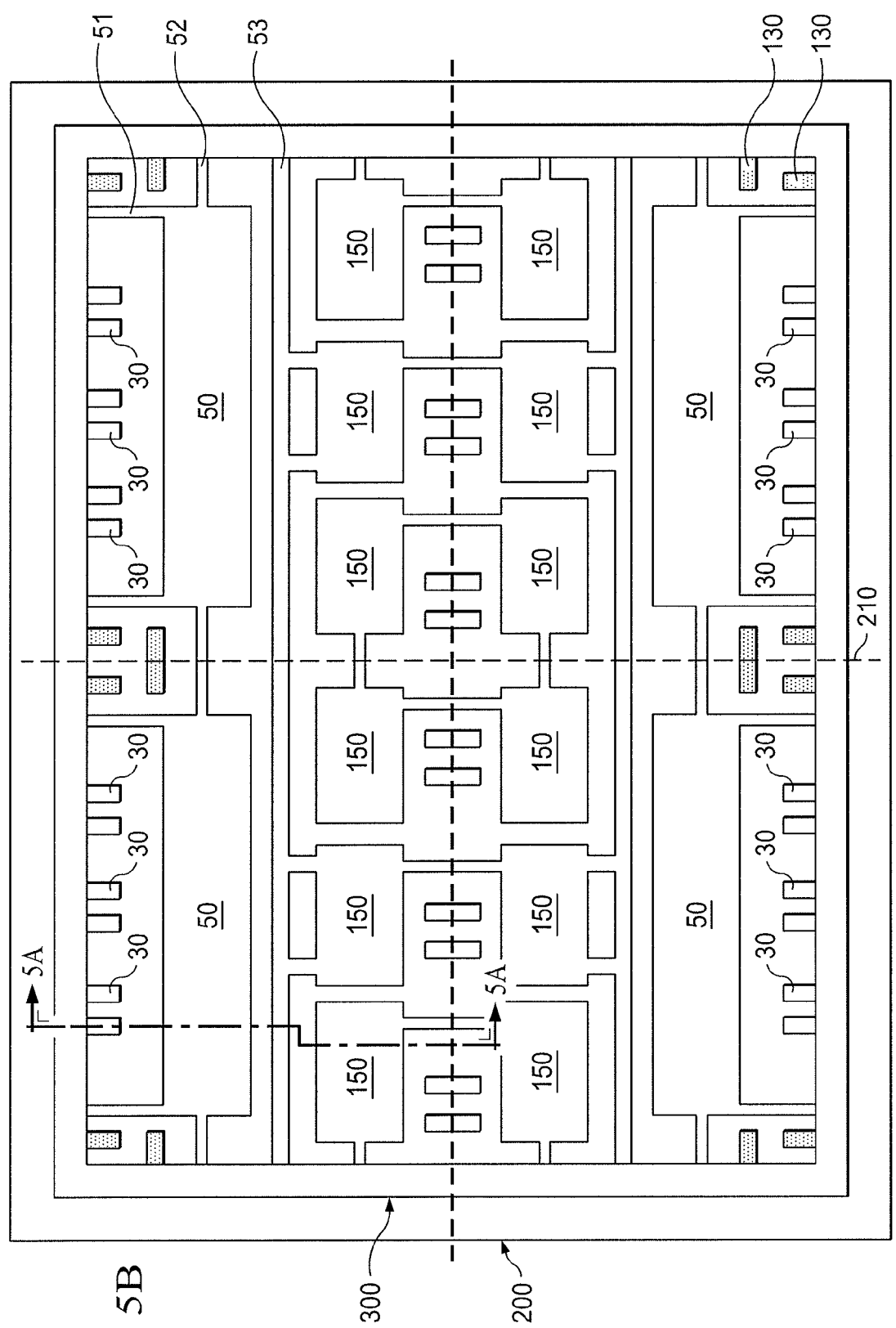

FIG. 5, which includes FIGS. 5A and 5B, illustrates a semiconductor package during a stage of fabrication. FIG. 5A illustrates a cross-sectional view while FIG. 5B illustrates a top view.

Referring to FIG. 5A, the lead frame 300 is placed over a carrier 200. The carrier 200 may be any suitable substrate to facilitate the assembly of the semiconductor module in various embodiments. The carrier 200 provides mechanical support and stability during processing. In various embodiments, the carrier 200 may be an adhesive tape, a frame, a plate made of a rigid material, for example, a metal such as nickel, steel, or stainless steel, a laminate, a film, or a material stack.

As illustrated in FIG. 5B, the lead frame 300 may be a part of a lead frame strip, which includes a plurality of lead frame units arranged in a matrix. Each lead frame 300 in the lead frame strip may have a central opening in which a plurality of die paddles is formed. Further, each lead frame 300 includes a first die paddle 50 and a plurality of second die paddles 150 connected to the outer frame through tie bars such as the vertical tie bar 51 and the horizontal tie bar 52. One or more central tie bars 53 may be used to connect the various die paddles together depending on the circuitry of the module being formed.

The lead frame 300 also includes a number of dummy leads 130, which as will be evident, are not configured to be connected to other components. Rather, the dummy leads 130 may violate some of the design rules associated with the design and placement of the leads 30 and tie bars. Examples of such design rules include creepage and clearance distances.

Each unit or lead frame 300 is separated from an adjacent lead frame 30 by a gap (dashed line), which form dicing streets 210. After completing the assembly process, the individual lead frame 300 may be separated by physically separating them along these dicing streets 210. Alternatively, the lead frame strip may be diced to form individual lead frame units prior to the assembly process.

Figure 6A:
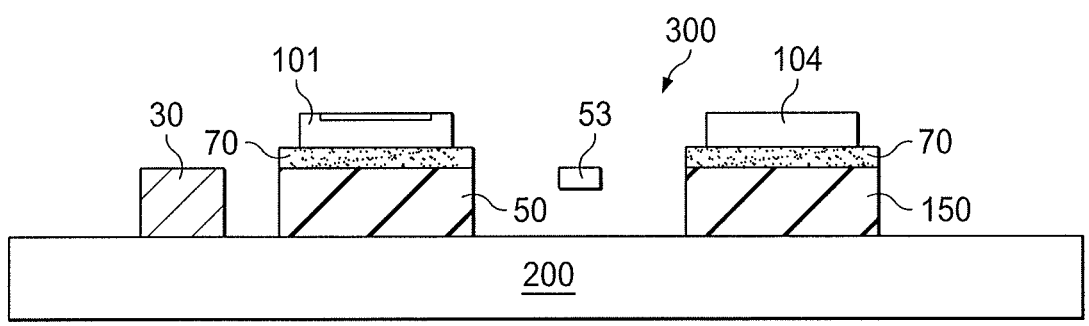
Figure 6B:
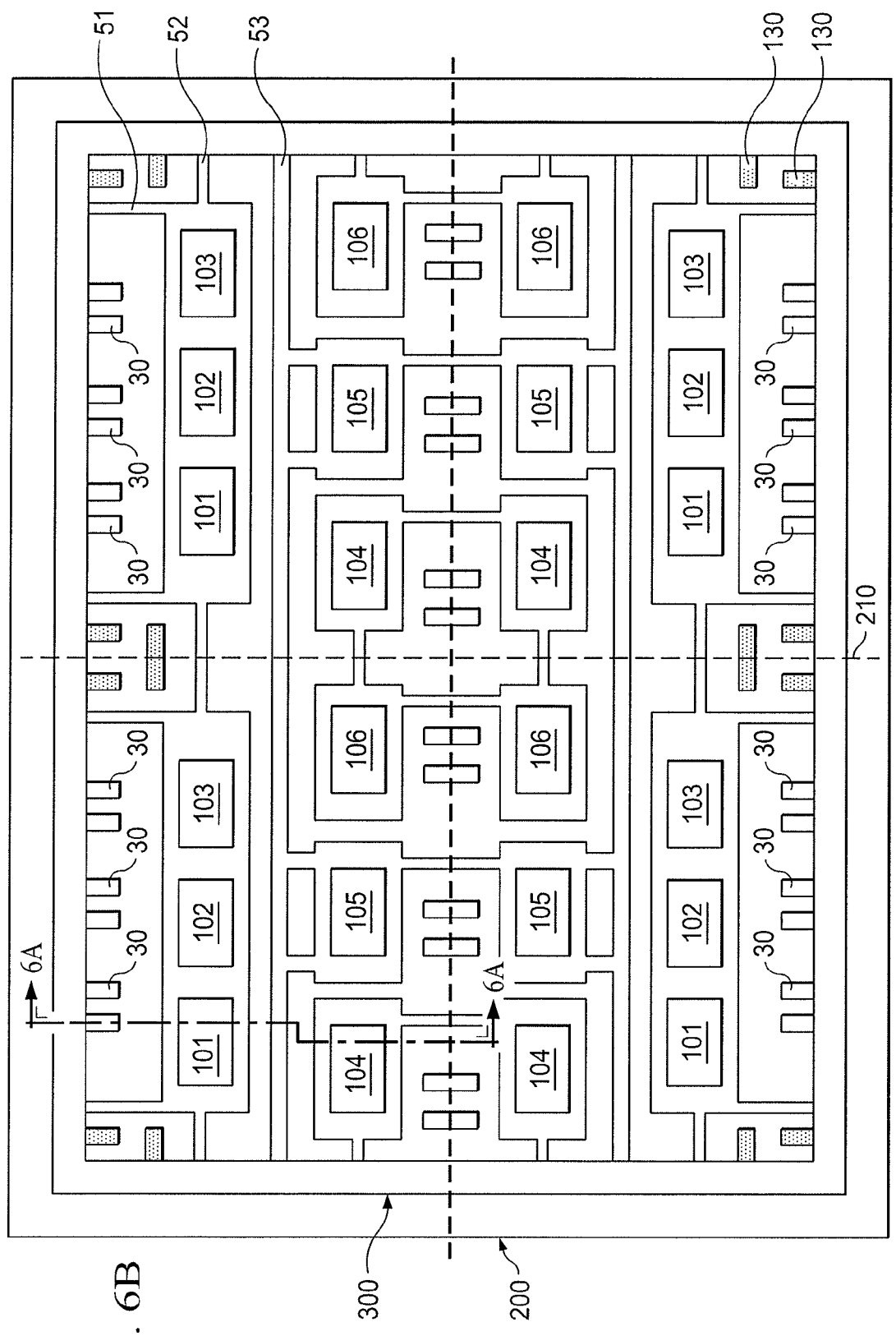

FIG. 6, which includes FIGS. 6A and 6B, illustrates a semiconductor package during a subsequent stage of fabrication after attaching dies to the lead frames. FIG. 6A illustrates a cross-sectional view while FIG. 6B illustrates a top view.

As next illustrated in FIG. 6A, semiconductor dies are attaches to the die paddles of the lead frame 300. As illustrated in FIG. 6B, a first die 101, a second die 102, and a third die 103 are attached to the first die paddle 50. Similarly, a fourth die 104, a fifth die 105, and a sixth die 106 are attached to each of the plurality of second die paddles 150. In some embodiments, each of the first, the second, the third, the fourth, the fifth, and the sixth dies 101, 102, 103, 104, 105, and 106 (hereinafter "dies 101-106") may be different from each other. Alternatively, one or more of the dies 101-106 may be similar to each other. Each of these dies 101-106 may be fabricated separately in various embodiments. The dies 101-106 may be formed on a silicon substrate such as a bulk silicon substrate or a silicon on insulator (SOI) substrate. Alternatively, each of the dies 101-106 may be a device formed on silicon carbide (SiC). Embodiments of the invention may also include devices formed on compound semiconductor substrates and may include devices on hetero-epitaxial substrates. In one embodiment, each of the dies 101-106 is a device formed at least partially on gallium nitride (GaN), which may be a GaN on sapphire or silicon substrate.

In various embodiments, each of the dies 101-106 may comprise a power die, which, for example, draw large currents (e.g., greater than 30 amperes). In various embodiments, the dies 101-106 may comprise a discrete vertical device such as a two or a three terminal power device. Examples of the dies 101-106 include PIN or Schottky diodes, MISFET, JFET, BJT, IGBT, or thyristor.

In various embodiments, each of the dies 101-106 may be a vertical semiconductor device configured to operate at about 20 V to about 1000 V. In one embodiment, each of the dies 101-106 may be configured to operate at about 20 V to about 100 V. In another embodiment, each of the dies 101-106 may be configured to operate at about 100 V to about 500 V. In yet another embodiment, each of the dies 101-106 may be configured to operate at about 500 V to about 1000 V. Because of the high voltages used, creepage is an important aspect of the design of the semiconductor package.

The dies 101-106 may include an insulated-gate bipolar transistor (IGBT) in some embodiments. In one embodiment, each of the dies 101-106 may be an NPN transistor. In another embodiment, each of the dies 101-106 may be a PNP transistor. In yet another embodiment, each of the dies 101-106 may be an n-channel MISFET. In a further embodiment, each of the dies 101-106 may be a p-channel MISFET. In one or more embodiments, each of the dies 101-106 may comprise a plurality of devices such as a vertical MISFET and a diode, or alternatively two MISFET devices separated by an isolation region.

Each of the dies 101-106 is placed over the lead frame 300. In various embodiments, each of the die may be sequentially attached in some embodiments. For example, a plurality of the first dies 101 may be attached to (placed over) all the plurality of lead frames 300 of the lead frame strip before attaching the plurality of second dies 102.

In various embodiments, the dies 101-106 may be attached to the lead frame 300 using an adhesive layer 70, which may be an insulating layer in one embodiment. In some embodiments, the adhesive layer 70 may be conductive, for example, may comprise a nano-conductive paste. In alternative embodiments, the adhesive layer 70 is a solderable material.

In one embodiment, the adhesive layer 70 comprises a polymer such as a cyanide ester or epoxy material and may comprise silver particles. In one embodiment, the adhesive layer 70 may be applied as conductive particles in a polymer matrix so as to form a composite material after curing. In an alternative embodiment, a conductive nano-paste such as a silver nano-paste may be applied. Alternatively, in another embodiment, the adhesive layer 70 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the adhesive layer 70.

The adhesive layer 70 may be dispensed in controlled quantities under the dies 101-106. The adhesive layer 70 having a polymer may be cured at about 125° C. to about 200° C. while a solder based adhesive layer 70 may be cured at 250° C. to about 350° C. Using the adhesive layer 70, the dies 101-106 are attached to the die paddles of the lead frame 300.

Figure 7A:
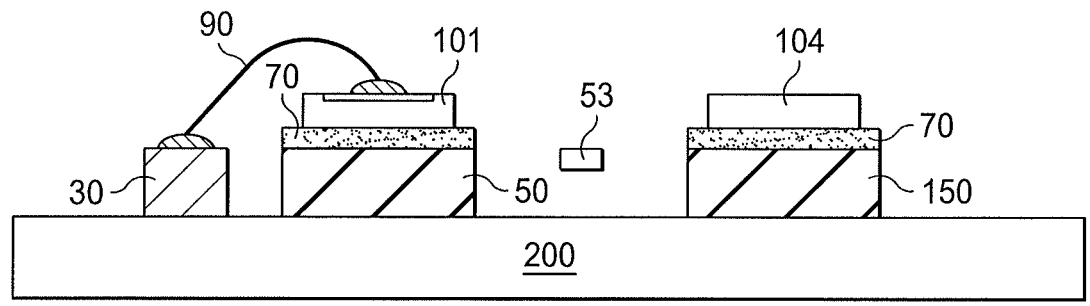
Figure 7B:
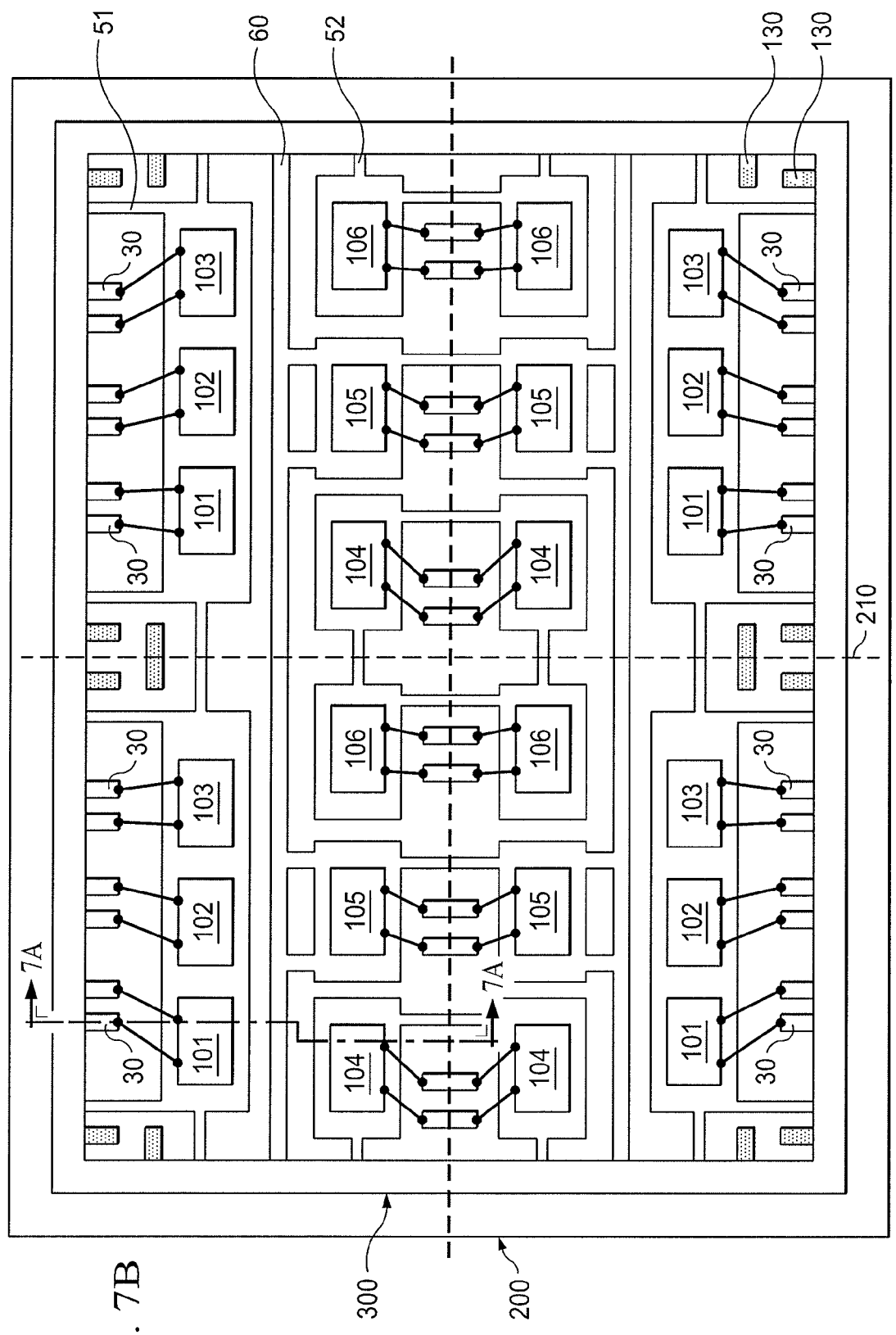

FIG. 7, which includes FIGS. 7A and 7B, illustrates a semiconductor package during a subsequent stage of fabrication after forming interconnects in accordance with embodiments of the invention. FIG. 7A illustrates a cross-sectional view while FIG. 7B illustrates a top view.

In various embodiments, ball bonding or wedge bonding may be used to form interconnects 90. In various embodiments, the interconnects 90, e.g., comprising wire bonds may be formed using thermosonic bonding, ultrasonic bonding, or thermo-compression bonding. Thermosonic bonding utilizes temperature, ultrasonic, and low impact force, and ball/wedge methods. Ultrasonic bonding utilizes ultrasonic and low impact force, and the wedge method only. Thermo-compression bonding utilizes temperature and high impact force, and the wedge method only.

For example, in one case, thermosonic bonding may be used with gold and copper wires. Two wire bonds are formed for each interconnection, one at contact regions of the first die 101 and another at a lead of the plurality of the leads 30 of the lead frame 300. Bonding temperature, ultrasonic energy, and bond force and time may have to be closely controlled to form a reliable connection from the first die 101 to the lead frame 300. In an alternative embodiment, the interconnects 90 may be formed using a galvanic process (electro chemical deposition). The interconnects 90 between the first die 101 and the lead frame 300 and between the dies 101-106 may be different especially between power dies in some embodiments.

Figure 8:
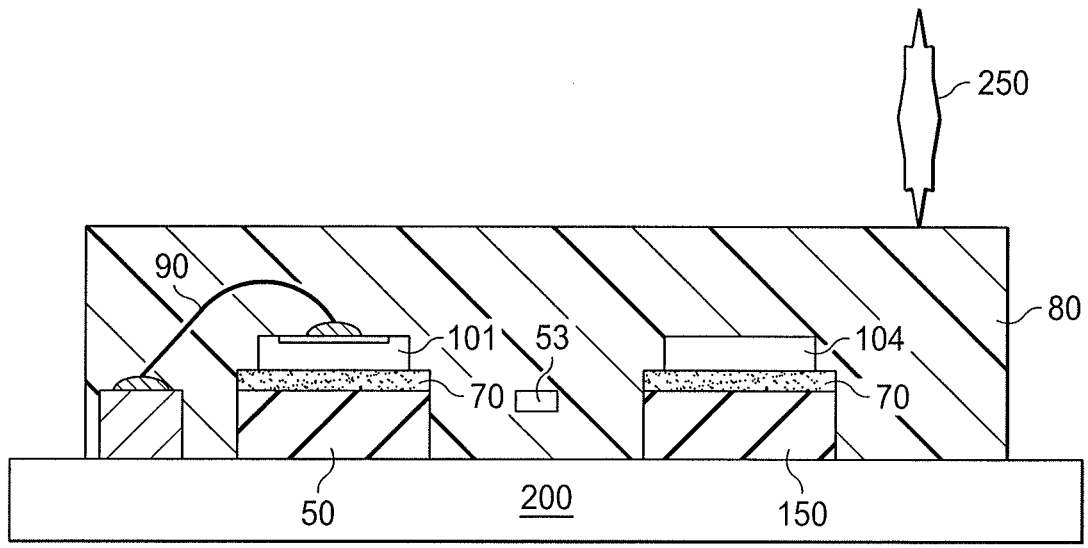
FIG. 8 illustrates a semiconductor package during a subsequent stage of fabrication after forming the package body in accordance with embodiments of the invention.

FIG. 8 illustrates a semiconductor package during a subsequent stage of fabrication after forming the package body in accordance with embodiments of the invention.

Referring to FIG. 8, an encapsulating material 80 is deposited over the lead frame 300, the dies 101-106, and the interconnects 90. In various embodiments, the encapsulating material 80 is coated over the entire carrier 200. The dies 101-106 are thus embedded within the encapsulating material 80. In one embodiment, the encapsulating material 80 is applied using a compression molding process. In compression molding, the encapsulating material 80 may be placed into a molding cavity, then the molding cavity is closed to compress the encapsulating material 80. Compression molding may be used when a single pattern is being molded. In an alternative embodiment, the encapsulating material 80 is applied using a transfer molding process. In other embodiments, the encapsulating material 80 may be applied using injection molding, granulate molding, powder molding, or liquid molding. Alternatively, the encapsulating material 80 may be applied using printing processes such as stencil or screen printing.

In various embodiments, the encapsulating material 80 comprises a dielectric material and may comprise a mold compound in one embodiment. In other embodiments, the encapsulating material 80 may comprise a polymer, a biopolymer, a fiber impregnated polymer (e.g., carbon or glass fibers in a resin), a particle filled polymer, and other organic materials. In one or more embodiments, the encapsulating material 80 comprises a sealant not formed using a mold compound, and materials such as epoxy resins and/or silicones. In various embodiments, the encapsulating material 80 may be made of any appropriate duroplastic, thermoplastic, or thermosetting material, or a laminate. The material of the encapsulating material 80 may include filler materials in some embodiments. In one embodiment, the encapsulating material 80 may comprise epoxy material and a fill material comprising small particles of glass or other electrically insulating mineral filler materials like alumina or organic fill materials.

The encapsulating material 80 may be cured, i.e., subjected to a thermal process to harden thus forming a hermetic seal protecting the dies 101-106, the adhesive layer 70, the interconnects 90, and the lead frame 300.

Thus, a plurality of semiconductor packages is formed. A singulation process may be used to separate the plurality of semiconductor packages into individual units. In one embodiment, a dicing tool 250 may be used to mechanically separate the leadframe strip to form physically separate semiconductor packages. The packages may be subsequently separated from the carrier 200. Although a batch process is illustrated above, in various embodiments, a sequential process may be used in which each semiconductor package is fabricated separately.

Figure 9A:
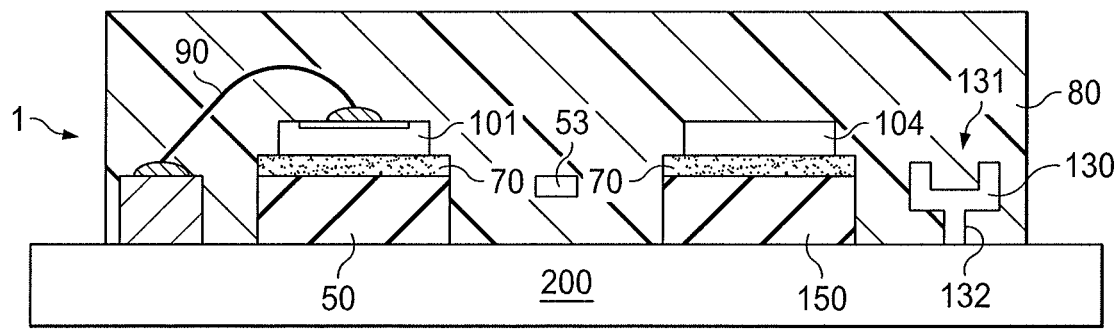
Figure 9B:
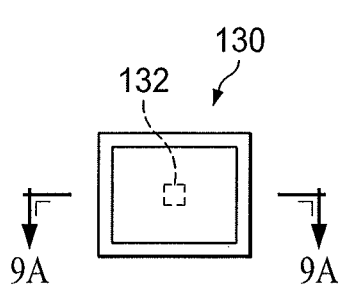
Figure 9C:
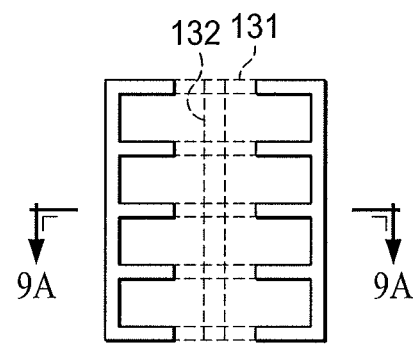

FIG. 9, which includes FIGS. 9A-9C, illustrates an alternative embodiment of the semiconductor package using a different dummy lead. FIG. 9A illustrates a cross-sectional view while FIGS. 9B and 9C illustrate alternative top views.

As illustrated in FIG. 9A, in various embodiments, the dummy leads 130 may have a different shape and size relative to the plurality of leads 30. The design of the dummy leads 130 may, for example, be optimized to improve mechanical stability. As an illustration, in FIG. 9A, the dummy lead 130 includes a top opening 131 and a neck region 132, which is exposed on the bottom surface of the semiconductor package 1. The top opening 131 may be designed to stabilize the structure and prevent delamination between the encapsulating material 80 and the dummy lead 130.

FIGS. 9B and 9C illustrate alternative top views of the dummy lead 130 shown in FIG. 9A. For example, in one embodiment, the dummy lead 130 may have a concentric shape. FIG. 9C illustrates an alternative finger structure in which the neck region 132 is formed as a rectangular central line around which a plurality of fingers is arranged. Such a finger structure may be used to improve the adhesion between the dummy lead 130 and the encapsulating material 80 further.

Figure 10:
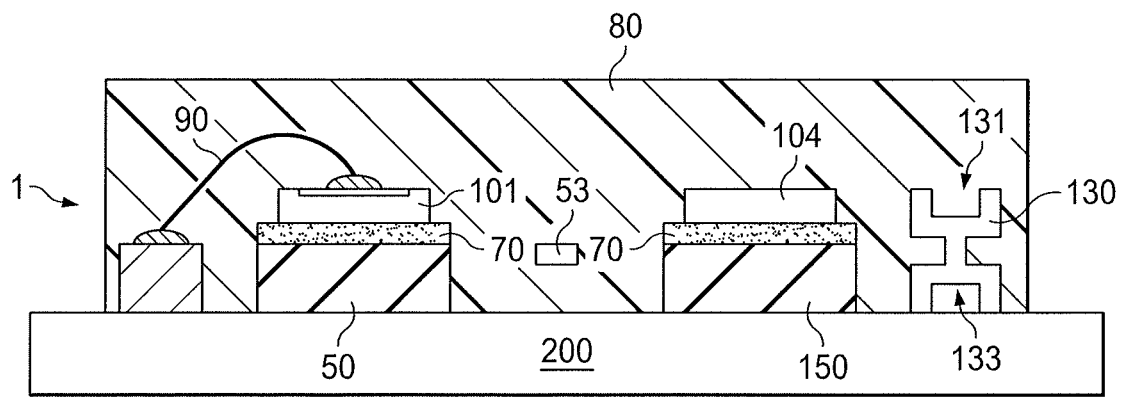
FIG. 10 illustrates a semiconductor package using an alternative dummy lead in accordance with an embodiment of the invention.

FIG. 10 illustrates a semiconductor package using an alternative dummy lead in accordance with an embodiment of the invention.

In FIG. 10, the dummy lead 130 includes a top opening 131 and a bottom opening 133. This may be used to strengthen the joint between the circuit board and the semiconductor package 1. In other words, the design of the dummy lead 130 may improve anchoring. Such design changes may help to homogenize the stress (minimize stress concentration) within the encapsulating material 80 in various embodiments.

Figure 11:
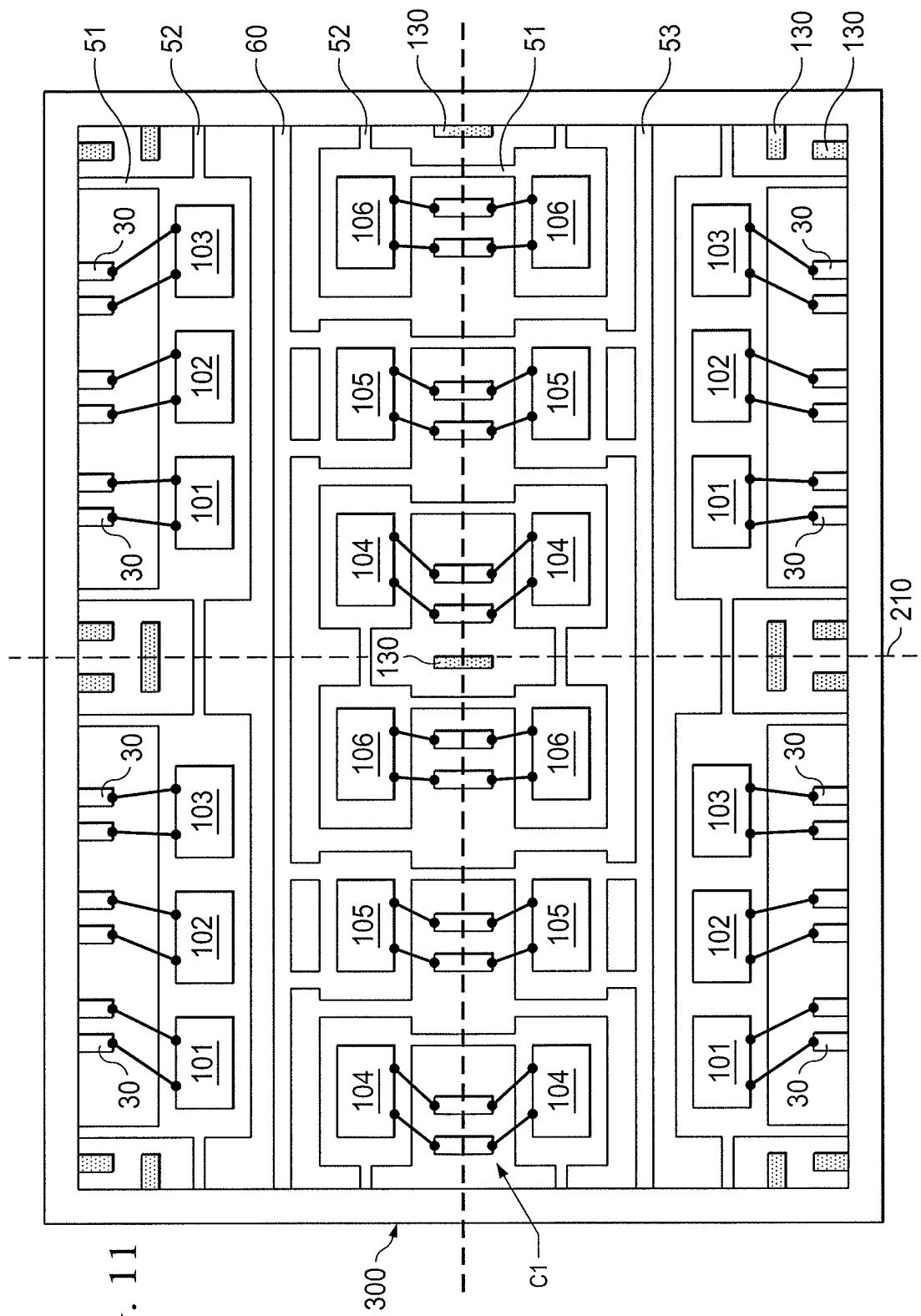
FIG. 11 illustrates a lead frame strip having a number of dummy leads in accordance with various embodiments of the invention.

FIG. 11 illustrates a lead frame strip having a number of dummy leads in accordance with various embodiments of the invention.

Referring to FIG. 11, the dummy leads 130 may be placed along the dicing street in one or more embodiments. In particular, in various embodiments, additional dummy leads 130 may be placed as long as they are surrounded by tie bars or leads of the plurality of leads 30 at the same potential. For example, as illustrated in FIG. 11, additional dummy leads 130 have been placed along the corners of the dicing street. These dummy leads are surrounded by portions of the vertical and horizontal tie bars 51 and 52, which are both connected to the same die paddle supporting the sixth die 106.

In various embodiments, different design rules may be adopted for the placement of the dummy leads 130. For example, in one embodiment, the dummy leads 130 may not be placed between two leads coupled to different potentials. For example, in FIG. 11, one of the dummy leads 130 is placed between the vertical tie bar 51 and the horizontal tie bar 52 coupled to the die paddle holding the sixth die 106 because the tie bars surrounding this dummy lead 130 are both coupled to a same potential. In contrast, the corner region C1 adjacent the horizontal tie bar 52 coupled to the fourth die 104 may not include a dummy lead because the horizontal tie bar 52 is coupled to a different potential than the leads 30 proximate the dummy lead position.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-11 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
   a first die paddle;
   an encapsulant disposed around the first die paddle, the semiconductor package having a first sidewall and a second sidewall, the second sidewall being perpendicular to the first sidewall, the first sidewall and the second sidewall defining a first corner region;
   a first tie bar disposed within the encapsulant, the first tie bar coupling the first die paddle and extending away from the first die paddle; and
   a first dummy lead disposed in the first corner region, the first dummy lead not being electrically coupled to another electrically conductive component within the semiconductor package, wherein a distance between the first dummy lead and the first tie bar is less than a shortest distance between the first tie bar and other leads or other tie bars in the semiconductor package.

2. The package of claim 1, wherein the first dummy lead is disposed between a portion of a first tie bar coupled to the first die paddle and a portion of a second tie bar coupled to the first die paddle.

3. The package of claim 1, wherein the distance between the first dummy lead and the first tie bar is less than a shortest distance between any leads in the semiconductor package.

4. The package of claim 1, wherein the first dummy lead comprises a top opening filled with the encapsulant.

5. The package of claim 1, wherein the first dummy lead comprises a bottom opening.

6. The package of claim 1, wherein the package is a high voltage power device.

7. The package of claim 1, wherein the first dummy lead is not thermally coupled to another thermally conductive component within the semiconductor package.

8. The package of claim 1, further comprising a first plurality of leads disposed along the first sidewall, each lead being electrically coupled to another component within the semiconductor package.

9. The package of claim 8, wherein the first dummy lead is disposed between a first lead of the first plurality of leads and a second lead of the first plurality of leads, wherein the first lead and the second lead are configured to be coupled to a same potential node.

10. The package of claim 8, wherein the first dummy lead comprises a different shape than each lead of the first plurality of leads.

11. The package of claim 8, wherein the first dummy lead comprises a different size than each lead of the first plurality of leads.

12. The package of claim 8, wherein the first dummy lead comprises a different orientation than each lead of the first plurality of leads.

13. The package of claim 8, further comprising:
    a first die disposed over the first die paddle;
    a second die disposed over the first die paddle; and
    a third die disposed over the first die paddle, wherein the first, the second, and the third dies are coupled to the first plurality of leads.

14. The package of claim 13, further comprising:
    a second die paddle disposed within the encapsulant;
    a fourth die disposed over the second die paddle;
    a third die paddle disposed within the encapsulant;
    a fifth die disposed over the third die paddle;
    a fourth die paddle disposed within the encapsulant; and
    a sixth die disposed over the fourth die paddle.

15. The package of claim 14, further comprising:
    a second plurality of leads disposed along a third sidewall opposite the first sidewall, each lead of the second plurality of leads being electrically coupled to another component within the semiconductor package, wherein the fourth, the fifth, and the sixth dies are coupled to the second plurality of leads.

16. The package of claim 14, further comprising:
    a third sidewall opposite the second sidewall, the first sidewall and the third sidewall defining a second corner region; and
    a second dummy lead disposed in the second corner region, the second dummy lead not being electrically coupled to another electrically conductive component within the semiconductor package.

17. The package of claim 1, further coupled to a circuit board.

18. A semiconductor package comprising:
    a package body having a first sidewall and a second sidewall, the second sidewall being perpendicular to the first sidewall, the first sidewall and the second sidewall defining a first edge;
    a first plurality of leads disposed along the first sidewall, each lead being electrically coupled to another component within the semiconductor package; and
    a first conductor disposed proximate the first edge within the package body, the first conductor not being coupled to any electrically conductive component, die pad, or lead within the semiconductor package, wherein each lead of the first plurality of leads is spaced apart from another lead of the first plurality of leads by a minimum creepage distance, wherein a distance between the first conductor and a lead of the first plurality of leads is less than the creepage distance.

19. The package of claim 18, wherein the first conductor is disposed between adjacent leads of the first plurality of leads.

20. The package of claim 19, wherein the adjacent leads of the first plurality of leads are coupled to a same potential node.

21. The package of claim 18, wherein the first conductor is not coupled to another thermally conductive component within the semiconductor package.

22. The package of claim 18, wherein all outside surfaces of the first conductor are covered by the package body.

23. The package of claim 18, wherein the first conductor and the first plurality of leads are exposed along a bottom surface of the package body.

24. The package of claim 18, further comprising:
a third sidewall opposite the second sidewall, the first sidewall and the third sidewall defining a second edge; and
a second conductor disposed proximate the second edge, the second conductor not being electrically coupled to another electrically conductive component within the semiconductor package.

25. The package of claim 18, wherein the first conductor comprises a top opening filled with a material of the package body.

26. The package of claim 18, wherein the first conductor comprises a bottom opening.

27. The package of claim 18, wherein the package is a high voltage power device.

28. The package of claim 18, further coupled to a circuit board.

29. A leadframe comprising:
a frame having an opening;
a first die paddle disposed within the opening, the first die paddle configured to mount a plurality of dies;
a first plurality of leads arranged along a side of the first die paddle, the first plurality of leads extending away from the first die paddle;
a first tie bar connecting the first die paddle to the frame; and
a dummy lead disposed in a corner region, wherein a minimum creepage distance between each lead and the first tie bar is larger than a distance between the dummy lead and the first tie bar.

30. The leadframe of claim 29, further comprising:
a second tie bar connecting the first die paddle to the frame, wherein the dummy lead is disposed between the first tie bar and the second tie bar.

31. The leadframe of claim 30, wherein a creepage distance between each lead of the first plurality of leads and the second tie bar is larger than a nearest distance between the dummy lead and the second tie bar.

32. The leadframe of claim 30, wherein the dummy lead has a different shape than each lead of the first plurality of leads.

33. The leadframe of claim 30, wherein the dummy lead includes a top opening.

34. The leadframe of claim 33, wherein the dummy lead includes a bottom opening.

\* \* \* \* \*